US011469035B2

(12) United States Patent
Yan et al.

(10) Patent No.: US 11,469,035 B2
(45) Date of Patent: Oct. 11, 2022

(54) HEAT DISSIPATION STRUCTURE FOR MAGNETIC COMPONENT AND MAGNETIC COMPONENT HAVING THE SAME

(71) Applicant: Delta Electronics (Shanghai) CO., LTD, Shanghai (CN)

(72) Inventors: Chao Yan, Shanghai (CN); Zejun Wang, Shanghai (CN); Yiwen Lu, Shanghai (CN); Zhihua Li, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 952 days.

(21) Appl. No.: 16/239,673

(22) Filed: Jan. 4, 2019

(65) Prior Publication Data

US 2019/0244747 A1    Aug. 8, 2019

(30) Foreign Application Priority Data

Feb. 5, 2018 (CN) .......................... 201810113322.5

(51) Int. Cl.
*H01F 27/28* (2006.01)
*H01F 27/16* (2006.01)
(Continued)

(52) U.S. Cl.
CPC ......... *H01F 27/2876* (2013.01); *H01F 27/16* (2013.01); *H05K 1/0206* (2013.01);
(Continued)

(58) Field of Classification Search
CPC .... H05K 1/0206; H05K 1/0209; H05K 1/021; H01F 2027/292; H01F 2027/065
See application file for complete search history.

(56) References Cited

U.S. PATENT DOCUMENTS 6,459,586 B1 * 10/2002 Miller .................. H01F 17/043
336/61
2011/0222246 A1    9/2011 Hsieh et al.
(Continued)

FOREIGN PATENT DOCUMENTS

CN        1489432 A     4/2004
CN      201063965 Y     5/2008
(Continued)

OTHER PUBLICATIONS

The EESR dated Mar. 22, 2019 by the EP Office.
The 2nd Office Action dated Oct. 11, 2021 for CN patent application No. 2018101133225.

*Primary Examiner* — Paresh Paghadal
(74) *Attorney, Agent, or Firm* — Qinghong Xu

(57) ABSTRACT

The present disclosure provides a heat dissipation structure for a magnetic component and a magnetic component having the same. The magnetic component includes a plurality of heat dissipation pins, which are disposed on the winding of the magnetic component, wherein the magnetic component has one or more windings. The heat dissipation structure includes a circuit board on which a plurality of heat dissipation channels are disposed, and the heat dissipation pins of the windings are in contact with the heat dissipation channels; a plurality of heat conduction portions are disposed correspondingly under the heat dissipation channels of the circuit board; a heat conduction layer is arranged under the heat conduction portions and contacts with the heat conduction portions; and a heat dissipation layer is arranged under the heat conduction layer and contacts with the heat conduction layer.

13 Claims, 4 Drawing Sheets

(51) Int. Cl.
   *H05K 1/02*       (2006.01)
   *H01F 27/29*      (2006.01)
   *H01F 27/06*      (2006.01)

(52) U.S. Cl.
   CPC ..... *H05K 1/0209* (2013.01); *H01F 2027/065* (2013.01); *H01F 2027/297* (2013.01)

(56) References Cited

U.S. PATENT DOCUMENTS

2012/0319810 A1* 12/2012 Tseng .................... H01F 27/027
                                                    336/65
2016/0125997 A1    5/2016  Hwang
2021/0251068 A1*   8/2021  Lau ........................ H05K 1/113

FOREIGN PATENT DOCUMENTS

| | | |
|---|---|---|
| CN | 101416305 A | 4/2009 |
| CN | 201508752 U | 6/2010 |
| CN | 201986260 U | 9/2011 |
| CN | 102401360 A | 4/2012 |
| CN | 102522182 A | 6/2012 |
| CN | 202551494 U | 11/2012 |
| CN | 202631938 U | 12/2012 |
| CN | 102522182 B | 6/2013 |
| CN | 103137305 A | 6/2013 |
| CN | 103617879 A | 3/2014 |
| CN | 204155728 U | 2/2015 |
| CN | 104684255 A | 6/2015 |
| CN | 205487655 U | 8/2016 |
| CN | 205979202 U | 2/2017 |
| KR | 20100003384 * | 3/2010 ............. H01F 27/12 |

* cited by examiner

HEAT DISSIPATION STRUCTURE FOR MAGNETIC COMPONENT AND MAGNETIC COMPONENT HAVING THE SAME

CROSS-REFERENCE TO RELATED APPLICATIONS

This application is based upon and claims priority to Chinese Patent Application No. 201810113322.5, filed on Feb. 5, 2018, the entire content of which is hereby incorporated by reference for all purposes.

TECHNICAL FIELD

The present disclosure relates to an electrical component, and in particular to a heat dissipation structure for a magnetic component and a magnetic component having the same.

BACKGROUND

Magnetic components are essential for power electronics, and are generally include an appropriate core wrapped with a suitable winding. However, the current flowing through the magnetic component and the hysteresis effect of the magnetic core causes electrical power loss and generates heat, resulting in obvious temperature rise of the magnetic component.

The high temperature of the magnetic component will result in many problems. For example, when the winding wire is too thin to withstand excessively high current, the insulating layer of enameled winding wire will be melt due to overheating, resulting in short circuit between windings. Additionally, the magnetic core of the magnetic component has a working temperature range, and the magnetic permeability of the magnetic core will decrease with the increase of the temperature when the temperature reaches a certain value, which will result in the decreasing inductance of the magnetic component.

Therefore, it is necessary to provide a heat dissipation structure for the magnetic component to avoid an excessive rise in temperature.

SUMMARY

In order to solve the problem of poor performance and damage of the magnetic component due to excessively high temperature, the present disclosure provides a heat dissipation structure for a magnetic component, a magnetic component having such a heat dissipation structure and a circuit board having such a heat dissipation structure.

According to an aspect of the present disclosure, a heat dissipation structure for a magnetic component is provided, wherein the magnetic component includes at least one winding, each of the winding has a plurality of heat dissipation pins, and the heat dissipation structure includes:

a circuit board provided with a plurality of heat dissipation channels, and the heat dissipation pins of the windings being in contact with the heat dissipation channels;

a plurality of heat conduction portions, disposed correspondingly under the heat dissipation channels and being in contact with a portion of the circuit board;

a heat conduction layer, laid under the heat conduction portions and being in contact with the heat conduction portions; and a heat dissipation layer, laid under the heat conduction layer and being in contact with the heat conduction layer.

According to another aspect of the present disclosure, there is provided a magnetic component having the heat dissipation structure described above.

According to a further aspect of the present disclosure, there is provided a circuit board. The circuit board comprises a magnetic component and a heat dissipation structure described above.

BRIEF DESCRIPTION OF THE DRAWINGS

The above and other features and advantages of the present disclosure will become more apparent from the detailed description of exemplary embodiments with reference to the accompanying drawings.

DETAILED DESCRIPTION

Figure 1:
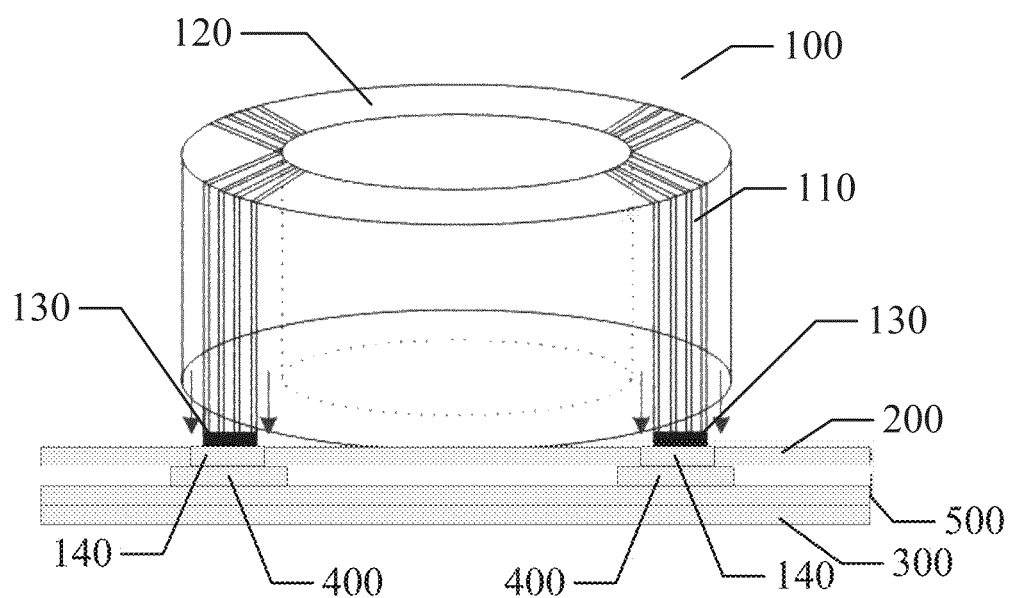
FIG. 1 is a schematic diagram of a heat dissipation structure for a magnetic component according to an embodiment of the present disclosure.

Exemplary embodiments will now be described more fully with reference to the accompanying drawings. However, the exemplary embodiments can be embodied in a variety of forms, and should not be construed as being limited to the embodiments set forth herein. Rather, these embodiments are provided so that this disclosure will be thorough and complete, and the concept of the exemplary embodiments can be fully conveyed to those skilled in the art. In the drawings, sizes of some components may be exaggerated or modified for clarity. The same reference numerals in the drawings denote the same or similar structures, and thus their detailed description will be omitted.

Furthermore, the described features, structures, or characteristics may be combined in any suitable manner in one or more embodiments. In the following description, numerous specific details are set forth to provide a thorough understanding of the embodiments of the disclosure. However, those skilled in the art will appreciate that the technical solution of the present disclosure may be practiced without one or more of the specific details, or other methods, elements and the like may be employed. In other instances, well-known structures, methods or operations are not shown or described in detail to avoid obscuring aspects of the present disclosure.

FIG. 1 illustrates a heat dissipation structure of an improved magnetic component according to an embodiment of the present disclosure.

A magnetic component includes, but not limited to, a transformer, an inductor or an integrated magnetic component having a transformer and an inductor. In the present disclosure, the magnetic component includes any component that may generate magnetic field while current flowing through its windings around a core or an air core.

A magnetic component 100 includes at least one winding 110, and the winding 110 is wound around a magnetic core 120. The magnetic core 120 may be a ferrite core or an iron core for enhancing magnetic flux, or may be an air core or a core of other material that only supports the windings. The winding 110 includes a plurality of pins 130. The pins 130 of the winding 110 are connected to conductive contacts on a circuit board 200 through plugging, soldering and the like. Hereinafter, the pins 130 are referred to as heat dissipation pins 130.

Electrical power loss occurs due to current flowing through the magnetic component 100 and the hysteresis effect of the magnetic core 120. These power losses are concentrated in a form of heat on the windings 110 and the core 120 resulting in a significant temperature rise in the magnetic component 100.

An excessively high working temperature, may have a significant impact on the reliability and performance of the magnetic component 100. First, if the wire diameter of the winding 110 of the magnetic component 100 is small, and the resistance of the winding is large correspondingly, which result in serious heating problem. When the winding 110 cannot withstand the heating power of the current flowing therethrough, the insulation layer of enameled winding wires 110 will melt, resulting in short circuit and damage to the magnetic component 100. Second, the magnetic core 120 has a working temperature range. When the temperature of the magnetic component 100 is higher than a certain value, the magnetic permeability of the magnetic core 120 rapidly drops, so that the performance of the magnetic component 100 is significantly degraded, and the inductance of the magnetic component 100 is reduced and even reaches to zero.

Therefore, in order to prevent the magnetic component 100 from overheating to affect the reliability and performance of the system, it is necessary to design a heat dissipation structure for the magnetic component 100 to dissipate heat timely.

The heat dissipation structure of the improved magnetic component 100 shown in FIG. 1 includes a plurality of heat dissipation pins 130, a circuit board 200, a heat dissipation layer 300, a heat conduction portion 400 and a heat conduction layer 500. The circuit board 200 is provided with a plurality of heat dissipation channels 140.

The heat of the magnetic component 100 is conducted through the heat dissipation pin 130 of the winding 110. A plurality of heat dissipation channels 140 are disposed on the circuit board 200 so that the heat dissipation pins 130 of the windings 110 are in contact with the heat dissipation channels 140 and are connected to the plurality of heat conduction portions 400 disposed under the heat dissipation channels 140 of the circuit board 200. The number of the heat dissipation channels 140 may correspond to the number of the heat dissipation pins 130. For example, one heat dissipation pin 130 corresponds to a corresponding heat dissipation channel 140, or a plurality of heat dissipation pins 130 share a larger heat dissipation channel 140, or one heat dissipation pin 130 uses a plurality of heat dissipation channels 140.

Figure 2:
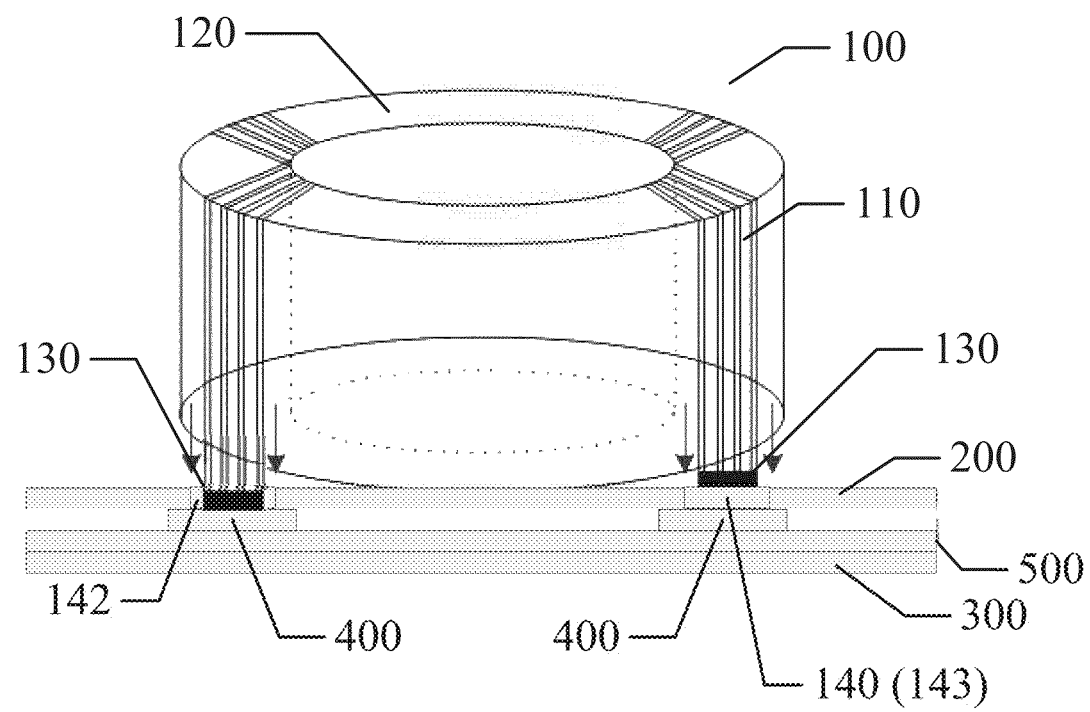
FIG. 2 is a schematic diagram of a heat dissipation structure for a magnetic component according to another embodiment of the present disclosure.

Referring to FIG. 2, there is shown a heat dissipation structure of an improved magnetic component according to another embodiment of the present disclosure. Compared with FIG. 1, the heat dissipation channel 140 has a plurality of structures. The heat dissipation channel 140 may be a through hole or via hole 142 disposed on the circuit board 200 and penetrating the upper and lower surfaces of the circuit board 200. The heat dissipation pin 130 is disposed in the through hole or via hole 142 to achieve both circuit connection and heat conduction at the same time. Further, the heat dissipation pin 130 is soldered in the through hole or via hole 142 to achieve better connection and better heat dissipation effect. In an application, the heat dissipation channels 140 can be solder pads 143 on the circuit board 200 to solder the heat dissipation pin 130 to form a thermally conductive plane. In addition, some of the heat dissipation channels 140 are formed by the through holes or the via holes 142 on the circuit board 200, and others are formed by the solder pads 143 on the circuit board 200, such that the heat dissipation pins 130 are soldered in the through holes or the via holes 142 and/or soldered to the solder pads 143.

The heat conduction portion 400 may be composed of a metal sheet, and the material of the metal sheet may he copper, aluminum or the like. For example, an alloy contains at least one of these metals with good heat conduction properties. Similar to FIG. 1, the number of the heat conduction portions 400 may correspond to the number of heat dissipation pins 130. For example, one heat dissipation pin 130 is connected to a corresponding heat conduction portion 400, or a plurality of heat dissipation pins 130 share a larger heat conduction portion 400, or one heat dissipation pin 130 uses a plurality of heat conduction portions 400. The heat conduction portion 400 is disposed correspondingly under the heat dissipation channels 140 and is in contact with a portion of the surface of the circuit board, which can increase the heat conduction area of the magnetic component to effectively dissipate heat.

The bottom layer of the circuit board 200 is generally copper-clad, but the outer surface of the circuit board generally has an insulating layer made of resin material so that the copper-clad does not directly contact the heat conduction portion. Alternatively, the insulating layer on the outer surface of the circuit board 200 may be removed, so the copper-clad layer can be directly used as the heat conduction portion 400 or a part thereof.

The heat conduction layer 500 is arranged under the heat conduction portion 400 and is in direct contact with the heat conduction portion 400. The heat conduction layer 500 is selected from one or more of thermal adhesive, heat-conducting silicone grease, a ceramic sheet and a thermal pad. The heat conduction layer 500 enlarges the heat conduction area to transfer heat from the plurality of heat conduction portions 400 to a larger heat dissipation member. Further, the heat conduction layer 500 can also function as an insulating layer.

Further, the heat dissipation structure further includes a heat dissipation layer 300 (the above mentioned larger heat dissipation member), and the heat dissipation layer 300 is laid under the heat conduction layer 500 and in direct contact with the heat conduction layer 500. Depending on the environment in which the magnetic component 100 is operated and the outline shape of the circuit board 200, different shapes of the heat dissipation layer 300 can be selected. For example, the heat dissipation layer 300 may be in the form of a heat dissipation fin or a heat dissipation plate. In a water cooling mode, the heat dissipation layer 300 may be a water cooling plate with a water circulation system, which takes the heat from the heat conduction layer 500 away through the water circulation flowing in the pipe. Compared with air cooling, the heat dissipation system in the water cooling method is relatively closed and has higher corrosion resistance.

Through the improved heat dissipation structure, the heat generated on the magnetic component 100 can be quickly transmitted to the heat conduction portion 400 under the circuit board 200 through the heat dissipation channel 140 in the circuit board 200, and then transmitted through the heat conduction layer 500 and the heat dissipation layer 300, as indicated by the arrows in FIGS. 1 and 2. Thus, the temperature of the magnetic component 100 can be effectively reduced to meet the requirements of reliability and performance. This structure has the advantages of simple process and low cost, and achieves a good heat dissipation effect by the heat channels.

Figure 3:
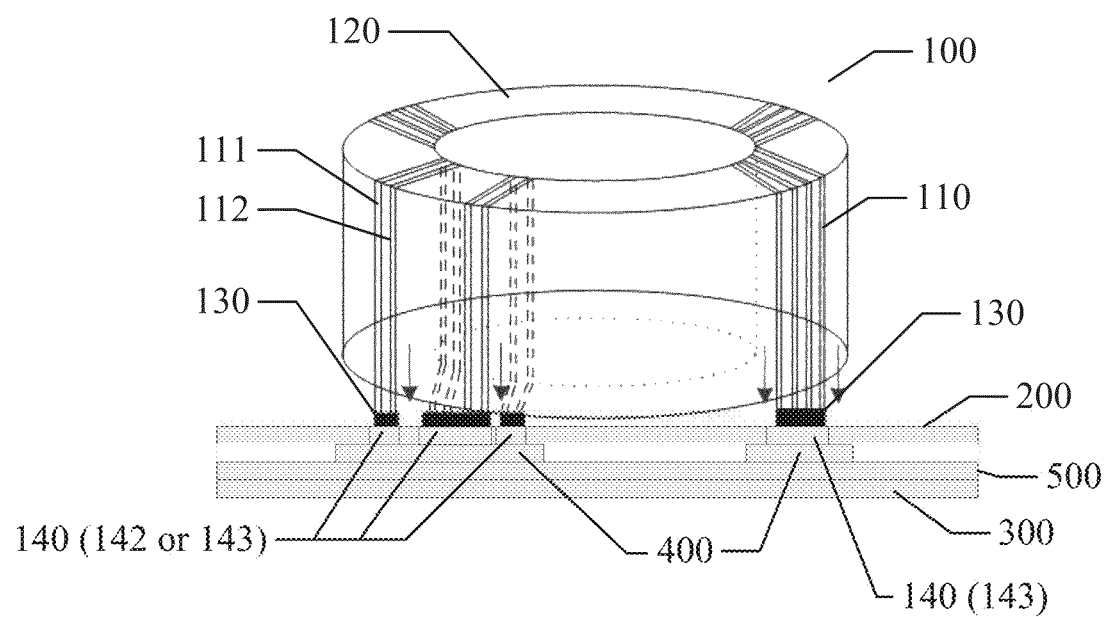
FIG. 3 is a schematic diagram of a heat dissipation structure for a magnetic component according to still another embodiment of the present disclosure.

Referring to FIG. 3, a heat dissipation structure of another improved magnetic component 100 according to an embodiment of the present disclosure is illustrated. The heat dissipation paths shown by the arrows are similar to those of FIGS. 1 and 2. In this embodiment, more heat conduction channels 140 are provided for heat dissipation pins 130 of a plurality of windings 110. It can be understood by those skilled in the art that the heat conduction channels 140 in FIG. 3 can be the through holes 142 or the solder pads 143, or some of the heat dissipation channels 140 are the through holes 142 and others are solder pads 143.

When the number of turns of the windings 110 is large, more heat dissipation pins 130 can be provided by splitting the windings 110. For example, when the windings 110 are wound, the windings 110 are divided into some segments, and the heat dissipation pins 130 are in the form of common junctions of the segments connected in series or in parallel. With the number of heat dissipation pins 130 increased, more heat dissipation channels 140 may be disposed on the circuit board 200, and more heat conduction portions 400 are laid under the heat dissipation channels 140 to increase the heat dissipation area. On the other hand, when the number of strands of the windings is large, which is similar to a plurality of windings 110 wound in parallel simultaneously, by splitting the windings, a plurality of separate heat dissipation pins 130 can be provided for the windings correspondingly. Then, corresponding heat dissipation channel 140 and corresponding heat conduction portion 400 may be provided for each heat dissipation pin 130, which can increase the heat conduction area to the same extent.

Similar to FIGS. 1 and 2, the number of heat conduction portions 400 may correspond to the number of heat dissipation pins 130. For example, one heat dissipation pin 130 uses a corresponding heat conduction portion 400, or a plurality of heat dissipation pins 130 share a larger heat conduction portion 400, or one heat dissipation pin 130 uses a plurality of heat conduction portions 400.

By this further improvement, a better heat dissipation effect than the embodiment shown in FIGS. 1 and 2 can be obtained.

In addition, such a multilayer heat dissipation structure may form a parasitic capacitance between the heat conduction layer 500 and the circuit board 200. Further, by properly designing the multilayer heat dissipation structure, the electromagnetic interference (EMI) performance of the system can be effectively improved.

According to an embodiment of the present disclosure, a magnetic component having a heat dissipation structure as described above is further proposed.

Figure 4:
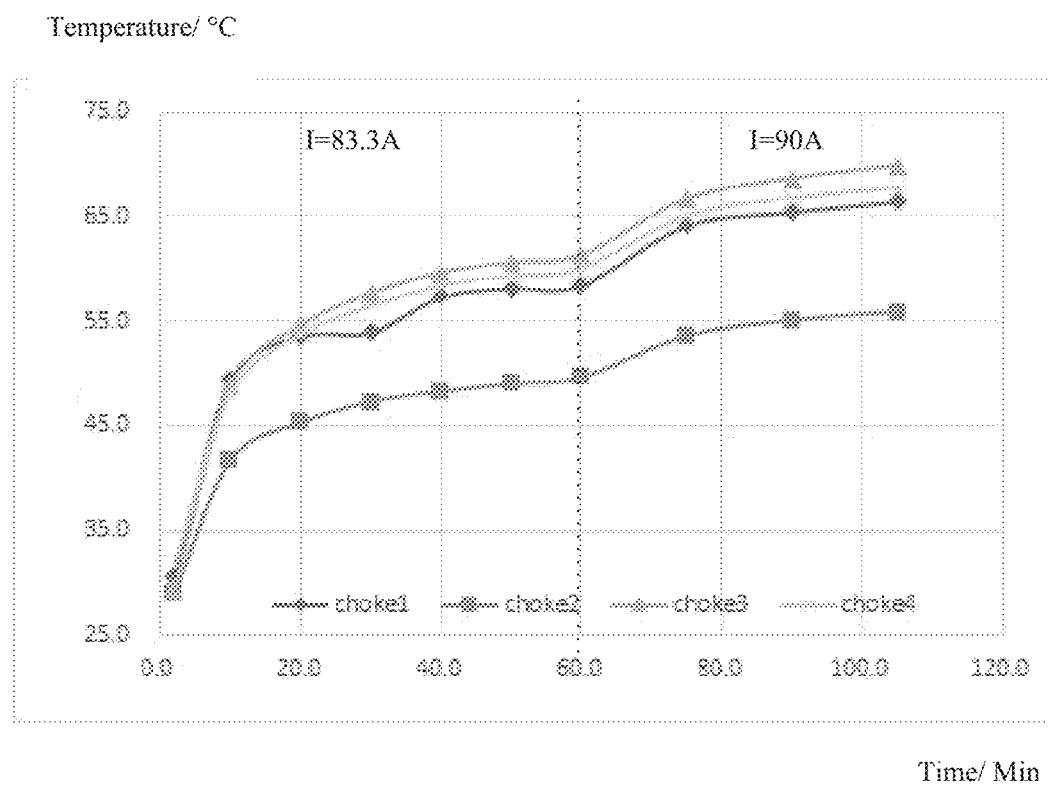
FIG. 4 is a temperature-time graph illustrating a heat dissipation effect of a heat dissipation structure for a magnetic component according to an embodiment of the present disclosure.

FIG. 4 is a temperature-time graph illustrating a heat dissipation effect of a heat dissipation structure for a magnetic component in an experiment according to an embodiment of the present disclosure. The left side of the graph shows the temperature of the magnetic component when the current I flowing through the magnetic component is 83.3 A. After the temperature of the component slowly rises from 30° C. to 60° C., the temperature does not rise substantially, and it can be seen that this embodiment achieves a good heat dissipation effect. Further, when the current I is increased to 90 A, the temperature of the magnetic component is only increased by 10° C. and is kept around 70° C. It can be seen that the heat dissipation structure of the embodiment of the present disclosure can achieve a good heat dissipation effect, and the reliability and performance problems of the magnetic component due to excessively high temperature can be effectively avoided.

Other embodiments of the present disclosure will be apparent to those skilled in the art from consideration of the specification and practice of the present disclosure. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

What is claimed is:

1. A heat dissipation structure for a magnetic component, comprising:
    heat dissipation pins, disposed on a winding of the magnetic component, wherein the winding is split into at least two strands, and two ends of each of the strands form the heat dissipation pins;
    a circuit board, provided with a plurality of heat dissipation channels, wherein the heat dissipation pins are in contact with the corresponding heat dissipation channels;
    a plurality of heat conduction portions, disposed correspondingly under the heat dissipation channels and being in contact with a portion of the circuit board;
    a heat conduction layer, which is arranged under the heat conduction portions and contacts with the heat conduction portions; and
    a heat dissipation layer, which is arranged under the heat conduction layer and contacts with the heat conduction layer.

2. The heat dissipation structure according to claim 1, wherein the winding is divided into at least two segments, and two ends of each of the segments form the heat dissipation pins.

3. The heat dissipation structure according to claim 1, wherein at least one of the plurality of heat dissipation channels is formed by a via hole in the circuit board, and the heat dissipation pin is soldered in the via hole of the circuit board.

4. The heat dissipation structure according to claim 1, wherein at least one of the plurality of heat dissipation channels is formed by a solder pad on the circuit board, and the heat dissipation pin is soldered on the solder pad.

5. The heat dissipation structure according to claim 1, wherein some of the plurality of heat dissipation channels are formed by via holes on the circuit board, and others are formed by solder pads in the circuit board.

6. The heat dissipation structure according to claim 5, wherein some of the heat dissipation pins are correspondingly disposed in the via holes of the circuit board, and others are correspondingly soldered on the solder pads of the circuit board.

7. The heat dissipation structure according to claim 1, wherein the heat conduction portions are metal sheet.

8. The heat dissipation structure according to claim 7, wherein the metal sheet is a copper sheet.

9. The heat dissipation structure according to claim 1, wherein the heat conduction layer is selected from one or more of thermal adhesive, heat-conducting silicone grease, a ceramic sheet and a thermal pad.

10. The heat dissipation structure according to claim 1, wherein the heat dissipation layer is a heat dissipation fin or a heat dissipation plate.

11. The heat dissipation structure according to claim 1, wherein the heat dissipation layer is a water cooling plate.

12. The heat dissipation structure according to claim 1, wherein the magnetic component is a single transformer, a single inductor, or an integrated magnetic component having a transformer and an inductor.

13. The heat dissipation structure according to claim 1, wherein the magnetic component comprises a magnetic core, and the winding is wounded on the magnetic core.

* * * * *